United States Patent [19]
Doran et al.

[11] Patent Number: 5,585,629
[45] Date of Patent: Dec. 17, 1996

[54] ELECTRON BEAM NANO-METROLOGY SYSTEM

[75] Inventors: Samuel K. Doran, Wappingers Falls; William A. Enichen; Timothy R. Groves, both of Poughkeepsie, all of N.Y.; Rodney A. Kendall, Ridgefield, Conn.; Henri A. Khoury, Yorktown Heights, N.Y.; Richard D. Moore, Hopewell Junction, N.Y.; Paul F. Petric, Brewster, N.Y.; James D. Rockrohr, Hopewell Junction, N.Y.

[73] Assignee: International Business Machines Corporation, Armonk, N.Y.

[21] Appl. No.: 584,988

[22] Filed: Jan. 11, 1996

Related U.S. Application Data

[63] Continuation of Ser. No. 265,298, Jun. 24, 1994, abandoned.

[51] Int. Cl.$^6$ ...................................................... H01J 37/28
[52] U.S. Cl. ............................................................ 250/310
[58] Field of Search ................................ 250/310, 396 R, 250/398, 397, 492.1, 491.1, 492.3, 442.11, 310

[56] References Cited

U.S. PATENT DOCUMENTS

| | | | |
|---|---|---|---|
| 3,558,880 | 1/1971 | Kniseley | 250/310 |
| 3,648,048 | 3/1972 | Cahan et al. | 250/495.1 |
| 3,760,180 | 9/1973 | Weber | 250/310 |
| 3,783,325 | 1/1974 | Shelton | 313/336 |
| 3,927,320 | 12/1975 | Chatfield | 250/310 |
| 4,063,103 | 12/1977 | Sumi | 250/492.1 |
| 4,103,168 | 7/1978 | Sturrock et al. | 250/442.11 |
| 4,249,077 | 2/1981 | Crawford | 250/306 |
| 4,334,139 | 6/1982 | Wittekoek et al. | 250/491.1 |
| 4,751,384 | 6/1988 | Murakoshi et al. | 250/310 |
| 4,767,926 | 8/1988 | Murakoshi et al. | 250/310 |
| 4,827,127 | 5/1989 | Todokoro | 250/310 |
| 4,871,911 | 10/1989 | Van Gorkom et al. | 250/310 |
| 4,939,371 | 7/1990 | Goto | 250/397 |
| 4,990,778 | 2/1991 | Norioka | 250/310 |
| 5,117,111 | 5/1992 | Nakamura et al. | 250/310 |
| 5,345,085 | 9/1994 | Prior | 250/397 |

OTHER PUBLICATIONS

IBM Technical Disclosure Bulletin, T. H. Chang, D.P. Kern and H. A. Khoury, vol. 33, No. 8, Jan. 1991, "Advanced Nanometrology Tool for X–Ray and Electron Beam Masks".

*Primary Examiner*—Jack I. Berman
*Attorney, Agent, or Firm*—Perman & Green

[57] ABSTRACT

An electron beam nanometer-level metrology tool includes an ambient temperature electron source and a movable stage for mounting a workpiece. The stage is adapted to position the workpiece's surface in a beam interrogation region. Electrostatic focus lenses convert electrons emitted by the electron source into a beam with a focal point that is positioned in the beam interrogation region. The lenses cause the electron beam to traverse a path that is generally orthogonal to the workpiece surface. Along the beam path are positioned upper and lower electrostatic deflection plates which are connected to an adjustable voltage source that applies ganged, opposite-sense d/c potentials thereto. Those potentials enable a scanning of the beam across the beam interrogation region while the beam remains substantially orthogonal to the workpiece surface, thereby enabling more accurate measurements of surface features. Within the metrology tool, all beam control surfaces are electrostatic so as to minimize power dissipation and temperature differentials.

11 Claims, 3 Drawing Sheets

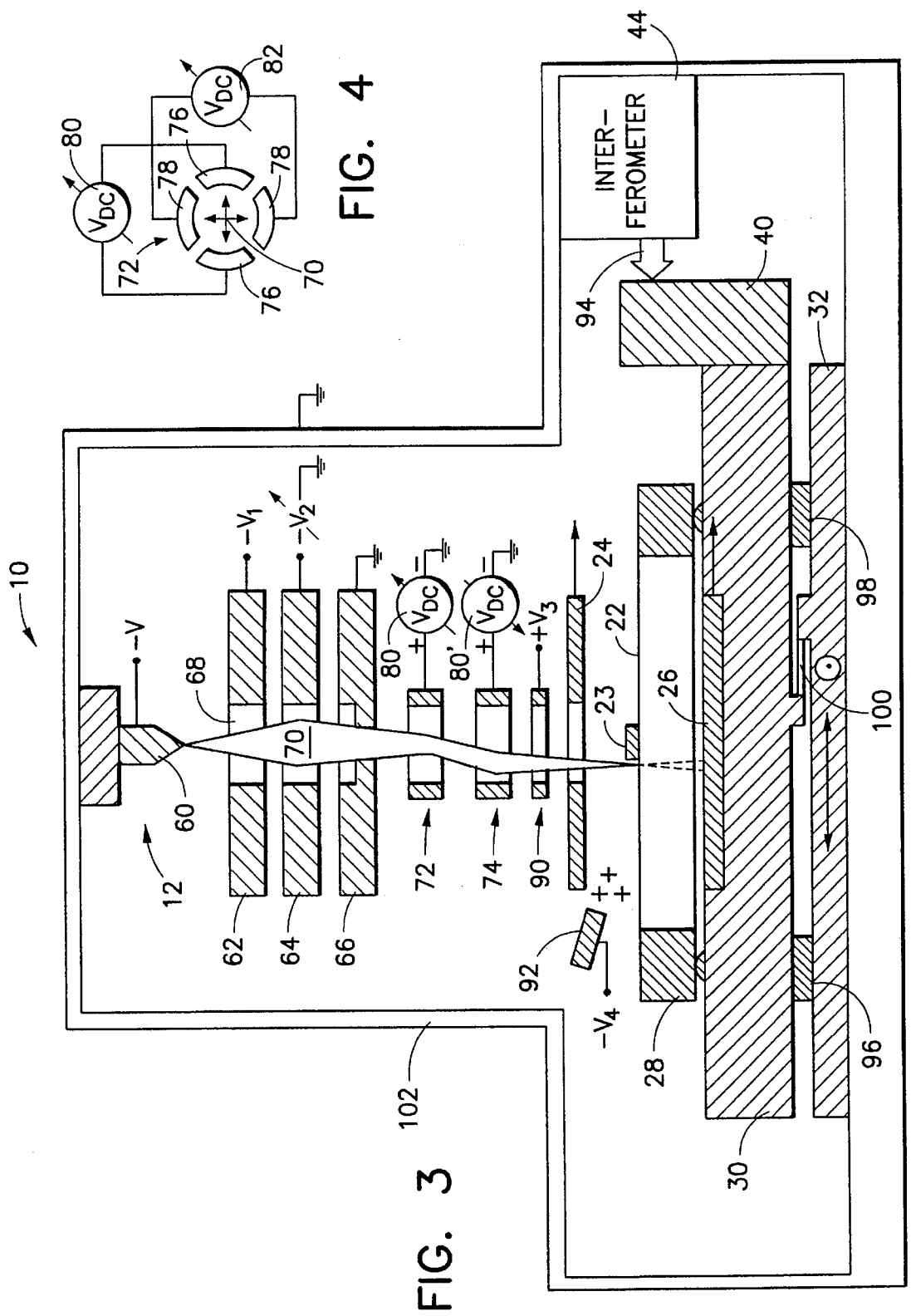

ELECTRON BEAM NANO-METROLOGY SYSTEM

This application is a continuation of application Ser. No. 08/265,298, filed on Jun. 24, 1994, now abandoned.

FIELD OF THE INVENTION

This invention relates to an electron beam nano-metrology system for measuring dimensions of physical patterns on a substrate, and more particularly, to an improved electron beam nano-metrology system that is accurately able to measure pattern features exhibiting minimum sizes in the range of 0.1–0.5 microns.

BACKGROUND OF THE INVENTION

The minimum size of pattern features (i.e., "critical dimension") of integrated circuits continues to decrease over the years. This trend is largely driven by the demand for increasing density of dynamic random access memory (DRAM). Other high performance semiconductor applications such as communications, analog and military needs also require increasingly smaller critical dimension features. The typical integrated circuit mask consists of as many as 25 independent masks, perhaps generated by different exposure tools. The relative placement of features for various mask levels must be accurate to within a small fraction of the critical dimension. Thus, the ability to measure and verify pattern placement accuracies is an essential part of lithography process control. At the present state of the art, commercially available metrology tools are capable of 50 nanometers accuracy.

A metrology tool adapted for use with semiconductor apparatus ideally should accommodate a variety of substrates, including x-ray masks, phase shifting reticles, 1:1 optical reticles, semiconductor wafers and electron beam scatter masks. Each of the substrate types has its own unique attributes, requiring versatility in the metrology tool. It is vital that the metrology tool have the ability to measure actual pattern features in a product, as opposed to measuring test targets distributed around the periphery of a product's active areas. The metrology tool must therefore, have a resolution that enables discrimination amongst features that exhibit a scale comparable with the critical dimension.

Existing tooling for X, Y coordinate metrology employ light beams that are focussed to a spot at the surface of the workpiece to be measured. Pattern edge positions are measured by detecting relative motion of the spot and the substrate. The edges of pattern features are used as the basis for further computations of feature centerline positions. The optical spot size is in the range of 0.5–2.0 microns. This exceeds the critical dimension on many substrates and necessitate that the substrate include a special measurement target (or targets). Because of the size of such targets, they cannot be located within the active circuit area where measurements are relevant.

The measurement time of prior art instruments is in the range of 4 seconds per axis, per feature. This is equivalent to 450 features measured per hour and is an extremely small fraction of the number of features on a typical mask. As a result, acceptance decisions are based on inadequate sample sizes.

Electron beam metrology tools have been used in the prior art for the measurement of semiconductor features. In U.S. Pat. Nos. 4,751,384 and 4,767,926, electron beam metrology systems are described by Murakoshi et al. wherein the surface of a sample is scanned by an electron beam and secondary electrons emitted from the surface are detected. The width of a pattern on the semiconductor surface is measured by using the detected signal, with detectors being disposed symmetrically with respect to the optical axis of the beam. A ratio of one of the output signals of the detectors to the other output signal is used to enable the measurement to be achieved. Although useful for measurement of feature sizes, the Murakoshi et al. system inherently lacks the stability required for accurate pattern placement measurement over 200 mm distances.

Chang et al. in "Advanced Nanometrology Tool for X-Ray Electron Beam Masks" IBM Technical Disclosure Bulletin, Vol. 33, No. 8, January 1991, pages 149–151 describe a metrology tool which employs a scanning, tunneling, microscope field emission tip to interrogate the surface of a workpiece. Relative motion between the workpiece and the scanning tunneling microscope tip enables surface features of the workpiece to be measured. However, modern masks and semiconductor wafers exhibit a large surface area, with some approximating 8 inches across their largest dimension. An ability to accurately provide relative movement between an STM tip and such a large semiconductor surface, across the entire surface of the wafer-mask structure, is both time consuming, difficult and expensive to achieve.

Accordingly, it is an object of this invention to provide an improved electron-beam nano-metrology tool which enables highly accurate and stable measurements, where the critical dimension of a substrate is in the range of 0.1–0.5 microns.

It is another object of this invention to provide an improved nano-metrology tool which is highly temperature stable and requires minimal thermal controls.

It is yet another object of this invention to provide an improved nano-metrology tool wherein errors due to beam interrogation directions are avoided.

It is yet another object of this invention to provide an improved nano-metrology tool wherein both conductive and non-conductive substrates can be subjected to a measuring electron beam.

SUMMARY OF THE INVENTION

An electron beam nanometer-level metrology tool includes an ambient temperature electron source and a movable stage for mounting a workpiece. The stage is adapted to position the workpiece's surface in a beam interrogation region. Electrostatic focus lenses convert electrons emitted by the electron source into a beam with a focal point that is positioned in the beam interrogation region. The lenses cause the electron beam to traverse a path that is generally orthogonal to the workpiece surface. Along the beam path are positioned upper and lower electrostatic deflection plates which are connected to an adjustable voltage source that applies ganged, opposite-sense dc potentials thereto. Those potentials enable a scanning of the beam across the beam interrogation region while the beam remains substantially orthogonal to the workpiece surface, thereby enabling more accurate measurements of surface features. Within the metrology tool, all beam control surfaces are electrostatic so as to minimize power dissipation and temperature differentials.

DESCRIPTION OF THE DRAWINGS

FIG. 3 is a schematic diagram illustrating certain features of an electron beam apparatus employed in the nanometrology tool of FIG. 1.

FIG. 4 is a schematic view of electrostatic deflection plates employed to position the electron beam of FIG. 1 with respect to a workpiece feature being examined.

DETAILED DESCRIPTION OF THE INVENTION

Figure 1:
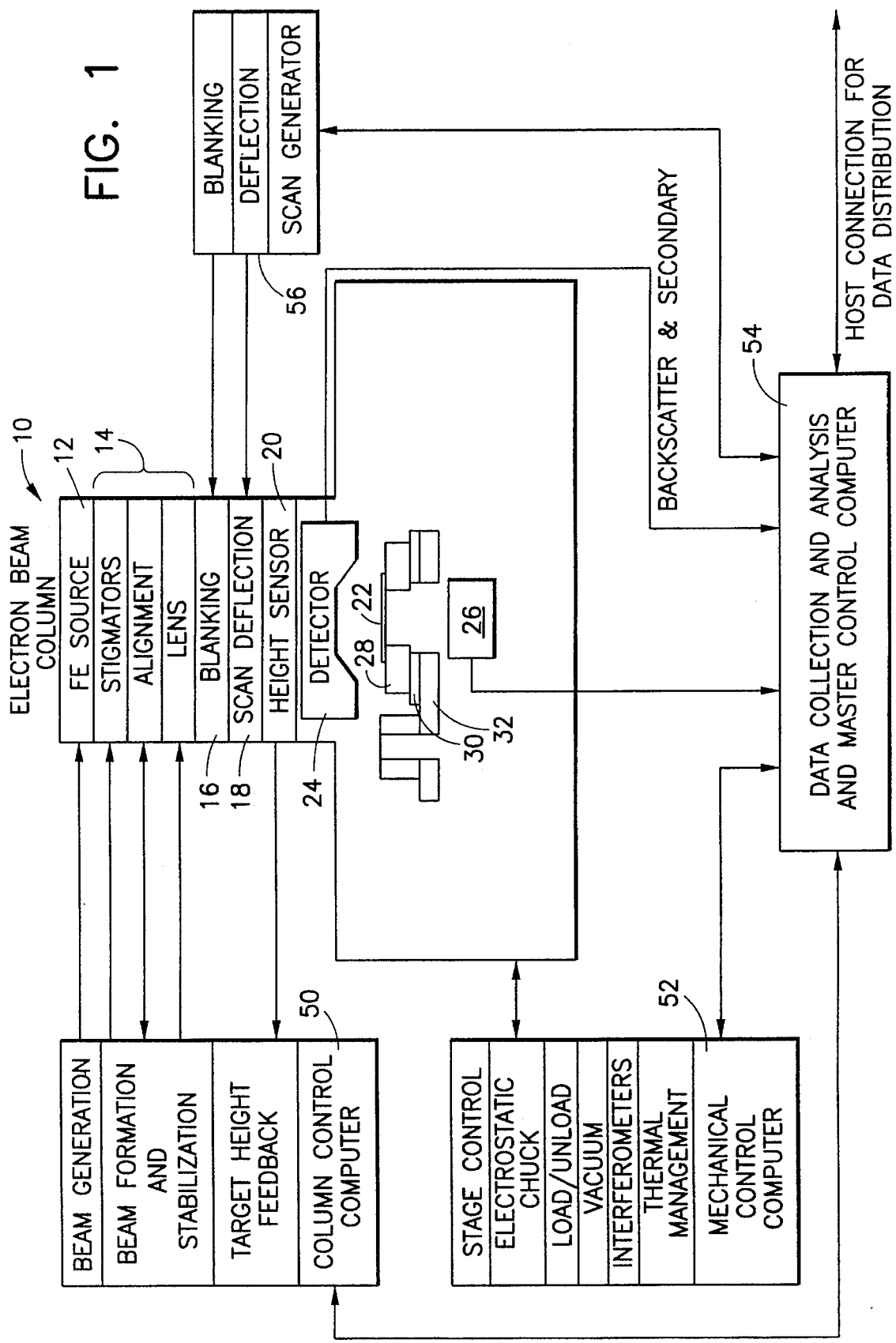
FIG. 1 is a high level block diagram of a nanometrology tool that incorporates the invention hereof.

Referring to FIG. 1, the central element in the nanometrology tool comprises an electron beam column 10. Electron beam column 10 includes a room temperature field emission source 12, electrostatic focusing and alignment components 14, a blanking system 16 and a scan deflection system 18 which assures an orthogonal relationship between the workpiece and an interrogating electron beam. An optical height sensor 20 enables the height of a workpiece 22 to be determined. A back-scatter detector 24 enables electrons that are back scattered from workpiece 22 to be detected. A transmission detector 26 is positioned beneath workpiece 22 and enables a transmission mode detection scheme to be implemented.

Workpiece 22 is held in place by a chuck 28, which is in turn, held on fine positioning stage 30. Fine positioning stage 30 is, in turn, positioned on a coarse positioning stage 32. Mechanisms (not shown) are positioned within electron beam column 10 to enable a wide range of X-Y movement of coarse positioning stage 32 so that workpiece 22 can be selectively positioned within an electron beam interrogation region. Fine positioning stage 30 is piezoelectrically actuated to enable vernier positioning of chuck 28 and workpiece 22 to selected, precise locations within the electron beam interrogation region.

Figure 2:
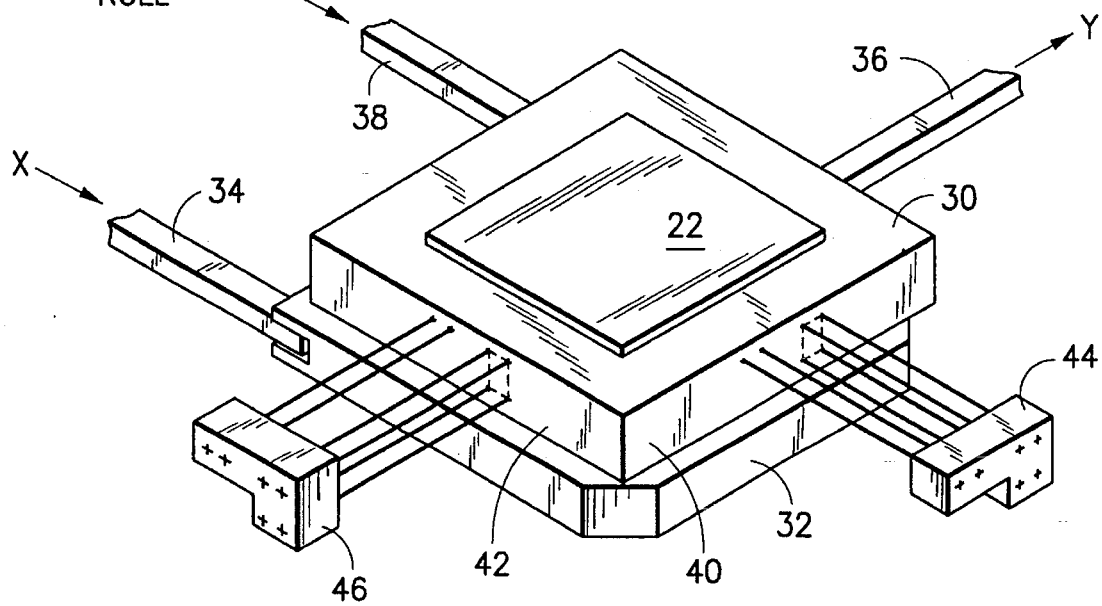
FIG. 2 is a perspective view of a stage/interferometer arrangement employed in the tool of FIG. 1.

A schematic showing of the workpiece holding fixture is illustrated in FIG. 2 wherein workpiece 22 is shown positioned on fine positioning stage 30 which is, in turn, supported by coarse positioning stage 32. A pair of X, Y arms 34, 36 enable coarse positioning of coarse stage 32, fine stage 30 and workpiece 22. The chuck which attaches workpiece 22 to fine positioning stage 30 has been omitted from FIG. 2. A third positioning arm 38 enables rotation of coarse positioning stage 32 about the Z axis. As will be seen in greater detail in FIG. 3, fine positioning stage 30 is mounted on coarse positioning stage 32 via flexible mounts. Piezoelectric actuators coupled between coarse positioning stage 32 and fine positioning stage 30 enable vernier positioning of fine positioning stage 30 so as to position features present on workpiece 22 within the beam interrogation region.

Mirror surfaces 40 and 42 are fixedly mounted on fine positioning stage 30, are orthogonally related and enable laser interferometers 44 and 46 to precisely determine the X, Y and Z location of fine positioning stage 30.

Returning to FIG. 1, three computers control the operation of electron beam column, i.e., column control computer 50, mechanical control computer 52 and master control computer 54. Column control computer 50 enables application of proper voltages to field emission source 12 and electrostatic lens system 14 to assure proper beam formation of the interrogating electron beam. Height sensor 20 provides its output to a target height feedback module within control computer 50 to enable the height of workpiece 22 to be determined.

Mechanical control computer 52 controls the operation of the mechanical components within electron beam column 10. Mechanical control computer 52 contains various subsystems which enable position detection of workpiece 22 via control and operation of laser interferometers 44 and 46 (FIG. 2). Mechanical control computer 52 further controls the movement of coarse positioning stage 32 and fine positioning stage 30 in accordance with outputs from the aforesaid interferometers. Lastly, mechanical control computer 52 implements a thermal management system wherein temperature control can be implemented to maintain the temperature within electron beam column 10 to an extremely precise range.

As will become apparent, all beam control mechanisms within electron beam column 10 are electrostatic and non-heat generating. While detectors 24 and 26 may generate modest amounts of heat, their absolute temperatures are easily controlled by the application of cooling liquid in accordance with the thermal management module within mechanical control computer 52. A load/unload chamber (not shown) enables a workpiece 22 present on coarse positioning stage 32 to enter a temperature soak chamber wherein its temperature is stabilized, prior to entry into the interior of electron beam column 10.

Master control computer 54 enables analysis of data received from detectors 24 and 26, and further, controls mechanical control computer 52 and column control computer 50. Master control computer 54 further controls the scan operation of the electron beam within electron beam column 10 via a blanking/deflection/scan generator module 56.

Turning to FIG. 3, details of electron beam column 10 will be described. Field emission source 12 is a room temperature electron emitter and comprises a finely pointed metal needle 60 to which a substantial negative bias is applied. That bias (−V) may be changed in accordance with the characteristics of the workpiece being examined. If the workpiece is conductive (e.g., a metal semiconductor mask), then −V can be set at −30,000 volts. By contrast, if the workpiece includes dielectric portions that may accumulate a charge during a beam interrogation action, −V can be set at approximately −1,000 volts so as to substantially reduce or eliminate charge accumulation on the workpiece. Needle 60 provides an emitted electron cloud that exhibits adequate brightness, even with such a substantial variation in applied energizing potentials.

To accomplish beam formation, an extraction electrode 62, a focus electrode 64 and a beam-defining aperture plate 66 are provided. The potential $-V_1$ applied to extraction electrode 62 is sufficiently positive with respect to −V to achieve an acceleration of electrons emitted from needle 60 and to direct them through aperture 68 towards focus electrode 64. A variable potential ($-V_2$) is applied to focus electrode 64 and, in the known manner, enables a focusing action to be imparted to beam 70 such that its focal point lies in the plane of workpiece 22. Beam-defining aperture plate 66 is maintained at system ground and corrects for various aberrations which may be present in beam 70.

As beam 70 exits from beam-defining aperture plate 66, it encounters first and second beam deflectors 72 and 74. Beam deflectors 72 and 74 are identical in structure and may comprise 4, 8, 12, etc., pole deflection elements that enable a deflection of beam 70 from its normal path. In FIG. 4, a four pole beam deflector 72 is illustrated, for exemplary purposes. In the well known manner, application of deflecting voltages to opposing pole pairs 76 and 78 enable deflection of a beam 70 passing therethrough. To avoid inducing optical aberrations in beam 70, it is preferred that first and second deflectors 72 and 74 each comprise 12 poles that are appropriately energized to achieve beam deflection.

Each beam deflector 72, 74 includes (in the four pole arrangement shown in FIG. 4), a first dc deflection source 80 and a second dc deflection source 82. DC deflection source 80 is connected to beam deflector 72 and is matched by a dc deflection source 80' connected to lower beam deflector 74. Similarly, beam deflection source 82 is connected to upper-beam deflector 72 and is matched by a dc deflection source 82' (not shown) that is connected to lower beam deflector 74. Independent control of the dc deflection sources (e.g., 80, 82) enables control of beam deflection along the x and y axis in an independent manner.

As shown in FIG. 3, dc deflection sources 80 and 80' are ganged so as to be jointly variable in opposite senses. More specifically, as dc deflection source 80 is adjusted positively, the ganging causes dc deflection source 80' to be adjusted in a negative direction by, preferably, an equal and opposite amount. Similar ganging exists between dc deflection sources 82 and 82' (not shown in FIG. 3).

The above described ganging control between the dc deflection sources connected to beam deflectors 72 and 74 enables equal and opposite deflections to be exerted on beam 70. Thus, whatever deflection is experienced by beam 70 in passing through the pole pieces which comprise beam deflector 72, is reversed by the action of the pole pieces of beam deflector 74. However, since beam 70 is perpendicular in entering beam deflector 72, it is perpendicular in exiting from beam deflector 74, but with a lateral displacement from the vertical orientation of beam 70 as it entered beam deflector 72. By appropriate ganged adjustment of the potentials applied to the pole pieces of deflectors 72 and 74, an electrical "rotation" of the deflecting field strengths can be achieved which enables a scanning of beam 70. At such time, beam 70 retains its orthogonal relationship with respect to workpiece 22 and physical features thereon (e.g., structure 23), which orthogonality prevents measurement variations which occur as a result of height variations of workpiece 22, parallax effects, etc.

While it is preferred that dc deflection sources connected to beam deflectors 72 and 74 vary in equal and opposite amounts as the ganged dc deflection sources are varied, the principle requirement is that the applied deflection voltages be varied in such a manner as to achieve an orthogonal scanning relationship of beam 70 with respect to workpiece 22. Thus, in lieu of varying the voltages by equal and opposite amounts, the voltages can be varied by different amounts if the distance between beam deflector 72 and 74 is also varied during the beam deflection adjustment. The latter is a less-preferred embodiment.

After emerging from beam deflectors 72, 74, electron beam 70 passes through a stray charge collector ring 90 that is biased slightly positive ($+V_3$) from system ground. Stray charge collector ring 90 performs a scavenging action on low energy stray secondary electrons that are generated when electron beam 70 impacts upon various surfaces within electron beam column 10. The scavenging action of stray charge collector ring 90 prevents those electrons from charging any exposed dielectric surfaces and thereby creating charge centers which can interact with measurement functions performed within electron beam column 10.

As indicated above, workpiece 22 may be such as to enable beam 70 to pass therethrough (e.g., an x ray mask) or it may be such as to reflect electron beam 70 (e.g., a solid semiconductor wafer structure). To enable measurements to be made, a back-scatter detector 24 and a transmission detector 26 are positioned on opposite sides of workpiece 22. Signals from these detectors are selectively utilized by master control computer 64 (FIG. 1) to achieve the desired measurement data.

If the surface or portions of the surface of workpiece 22 are dielectric, beam 70 may cause a charge accumulation thereon which, if not counteracted, will seriously effect the measurements. To negate such charges, an ion gun 92 is positioned to the side of workpiece 22. As is known, ion gun 92 includes an integral laser and gas source which is ionized upon interaction between the laser beam and gas molecules. The outer shield of ion gun 92 is maintained slightly negative from system ground (by a few tenths of a volt, $-V_4$). Thus, only when the charge on workpiece 22 becomes somewhat negative is there an attractive force exerted on the ions that are created within ion gun 92. In such case, those ions migrate to the surface of workpiece 22 and negate the negative charge buildup. The system is self controlling because when the potential on the surface returns towards ground, the attractive force is lessened upon the ions from ion gun 92 (and vice versa).

Workpiece 22 is mounted on a frame 28 which is, in turn, held kinematically by fine positioning stage 30. Mirror 40, which is integral with fine positioning stage 30, interacts with interferometer 44 in the manner above described. It is important that column control computer 50 locate the vertical position of workpiece 22 so that laser beam 94 from interferometer 44 is positioned at exactly the same height. This avoids the creation of Abbe errors which can occur if there is an offset between the height of beam and workpiece 22.

Figure 5:
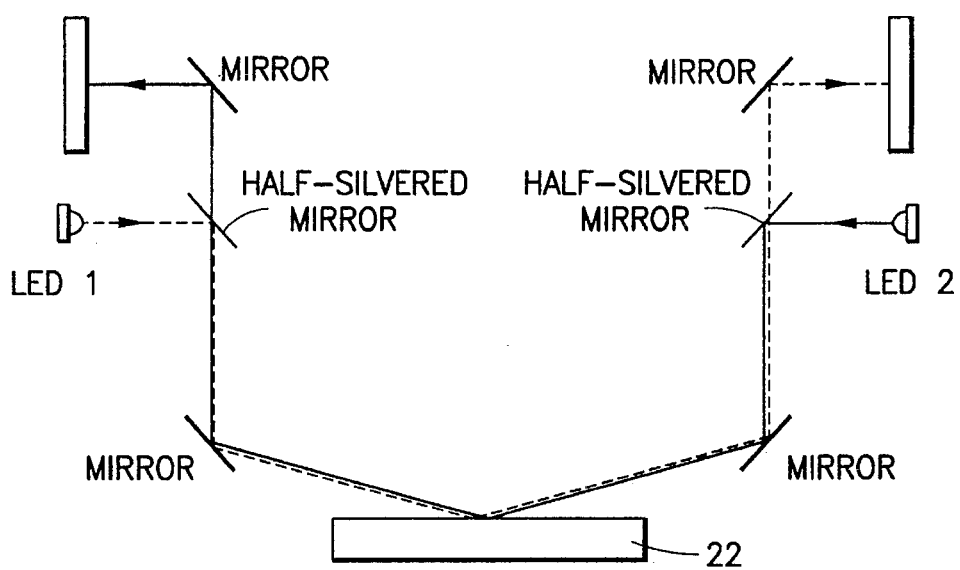
FIG. 5 is a schematic view of an optical system for determining the height of a workpiece.

In FIG. 5, the workpiece height detection system is shown as it is incorporated into electron beam column 10. The system includes a pair of light emitting diode lasers that comprise a dual light beam target height sensor. The system works by directing a focussed light beam towards the workpiece at a grazing angle and measuring the position of the reflective light beam on a linear reticon. As the target height changes, the position of the incident light on the linear reticon changes proportionately. The two light beams are preferably used 180° apart to cancel effects due to tilt of the target. Outputs from the reticons enable adjustment of fine positioning stage 30 so as to prevent an offset in height between laser beam 94 and workpiece 22.

Returning to FIG. 3, fine positioning stage 30 is mounted, via flexible mounts 96, 98, etc. on coarse positioning stage 32. A plurality of piezoelectric actuators 100 (only one is shown) are positioned between posts extending from fine positioning stage 30 and coarse positioning stage 32 to enable vernier alteration of the position of fine positioning stage 30. A further set of piezoelectric actuators (not shown) are positioned between stages 30 and 32 to enable height adjustments. The aforesaid piezoelectric actuators enable X, Y, Z, rotation, pitch and yaw adjustments of fine positioning stage 30 with respect to coarse positioning stage 32.

The entire mechanism described in FIG. 3 is contained within an outer housing 102 which provides the main reference for the entire electron beam column and mechanical subsystem. As such, all measurements are referenced to structure 102.

In operation, workpiece 22 is loaded into the metrology tool by an operator via a cassette or other handling means (not shown). Workpiece 22 will have already been mounted in an appropriate electrostatic chuck 28 or equivalent carrier. Workpiece 22 and chuck 28 are then transported to a temperature stabilization chamber where they both reside until both have reached a stable temperature. Chuck 28 and workpiece 22 are then transported to fine positioning stage 30 where they are locked in place. Coarse positioning stage 32 is then operated to move fine positioning stage 30 and workpiece 22 to a desired position with respect to electron beam 70. This operation positions a mark, an isolated edge, or a complex feature on workpiece 22 into a beam interrogation region. Fine positioning stage 30 enables vernier positioning of workpiece 22 so as to assure proper relative positioning between beam 70 and a feature (e.g., land 23) to be examined. Beam 70 is then scanned, via ganged operation of beam deflectors 72 and 74 over a small area, the size of which takes into account the accuracy of the mechanical positioning of workpiece 22 and the tolerances of the feature to be measured. It is to be understood that beam 70 is scanned only over a very small beam interrogation region (on the order of several microns), relying principally upon stages 32 and 30 to achieve proper positioning of workpiece 22 into the beam interrogation region.

Responses from an electron detector (either detector 24 or detector 26) are recorded by master control computer 54 along with the instantaneous position of scanned electron beams 70, the instantaneous position of workpiece 22, as measured by interferometers 44, etc. and the instantaneous "height" of the surface of workpiece 22 as measured by the optical sensor shown in FIG. 5. Responses from the repeated scans are averaged to reduce random noise and software then analyzes the information to detect the position of features within the scanned area. This information is then reported as an absolute position of the feature. The stages may then be moved so as to enable a new measurement position to be taken and the measurements repeated.

Using the above measurement technique, beam 70 unavoidably deposits energy in the surface of workpiece 22, thus heating the surface. The resulting temperature rise causes local and global thermal expansion. This in turn may distort the measurement surface, causing errors. Master control computer 54 is operated to minimize this thermal effect. Minimum errors are achieved by using a minimum instant dose of electron beam energy, consistent with obtaining the desired information. The information content can be described by two parameters, namely spatial resolution and signal-to-noise ratio. In the case of shot noise limited edge detection, an expression for the measurement of resolution d is as follows:

$$d = \sqrt{\frac{\pi}{2n}} \, \sigma \qquad (1)$$

where σ lateral probe size standard deviation, and n=number of detected quanta per pixel. Eq. (1) applies to a probe with Gaussian intensity distribution. It is noticed that square root of n equals signal-to-noise-ratio for the shot noise limit and is the optimum condition in which all other noise sources are negligible. The probe size σ is determined by the optical system. The dwell time of the probe on any single pixel is given by t=en/I, where e is the electronic charge, and I is the incident current of the electron beam. The method adjusts the scan speed of the electron beam so that the dwell time is the minimum consistent with the desired resolution d, together with the probe size σ and current I. From equation, scan speed v is:

$$v = \frac{d}{t} = \frac{2Id^3}{\pi e \sigma^2} \qquad (2)$$

Equation 2 expresses the optimum scan condition in terms of the measurable experimental parameters, where thermal distortion is minimized.

The above described nanometrology tool enables high precision nanometer—level measurements.

(1) Heat sources are minimized within the electron beam column, through the use of electrostatic beam control devices. No electromagnetic coils or other heat generating current carriers are present in the column. Other heat generating sources (e.g., beam detectors and various metal components which intercept the electron beam) are thermally sensed and cooled so as to achieve a uniform temperature profile over the column. The electron source is a room temperature field emitter which does not add to the thermal load of the column.

(2) Beam landing on the workpiece surface is normal and eliminates errors from target height variations and parallax effect.

(3) The accelerating voltage applied to the electron beam source is variable to enable either a high voltage mode for use on membrane masks or for use with back scatter/secondary electron detection with conductive bulk targets) or (2) a low voltage mode (nominally 1–2 kv) for back scatter/secondary electron detection on dielectric bulk targets.

(4) The use of a scanned focused electron beam as the "feature interrogator" enables measurements to be obtained at a rate that is approximately two orders of magnitude faster than prior art systems, and further enables the measurements to be taken directly from within the active pattern array.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. An electron beam, nanometer-level metrology tool for making precise measurements of relative positions of pattern features within an active pattern array of a workpiece, said tool comprising:

an ambient temperature electron source; movable stage means for mounting a workpiece having a surface with physical features to be measured, and for positioning said workpiece surface in a beam interrogation region;

beam control means including ambient temperature electrostatic focus means for converting electrons emitted by said electron source into an electron beam with a focal point in said beam interrogation region, said electron beam traversing a path to said beam interrogation region that is generally orthogonal to said workpiece; and means for determining distance measurements between submicron-sized features on said workpiece surface where the distance measurements are very large compared with the size of the features from interactions of said beam and workpiece surface.

2. The electron beam, nanometer-level metrology tool as recited in claim 1, wherein said opposite sense d.c. potentials are identical, opposite polarity voltages.

3. The electron beam, nanometer-level metrology tool as recited in claim 13, wherein each said upper and lower electrostatic deflection means comprises:

plural deflection plates positioned about said path, said adjustable voltage means enabling a two-dimensional deflection of said beam, while retaining said substantially orthogonal relationship of said beam to said workpiece surface.

4. The electron beam, nanometer-level metrology tool as recited in claim 1, wherein said beam control means in said metrology tool are entirely electrostatic, so as to minimize power dissipation within said tool.

5. The electron beam nanometer-level metrology tool as recited in claim 1, wherein said electron source employs field emission to generate electrons.

6. The electron beam, nanometer-level metrology tool as recited in claim 5 further comprising:

means for applying a first high-level voltage to said electron source when said workpiece surface is conductive and for applying second lower level voltage to said electron source when said workpiece surface includes a dielectric feature, said second lower level voltage reducing charge buildup on said dielectric feature.

7. The electron beam, nanometer-level metrology tool as recited in claim 1, wherein said movable stage means comprises:

a first coarse movement stage for positioning said workpiece into said beam interrogation region;

a second fine movement stage for positioning said workpiece within said beam interrogation region;

laser interferometer means associated with said second fine movement stage and employing a laser beam for determining a position of said fine movement stage; and control means for moving said first and second stages to assure that said laser beam is incident on said second fine movement stage at a position that is coplanar with said workpiece, so as to avoid Abbe errors.

8. The electron beam, nano-metrology tool as recited in claim 7, further comprising:

optical means for measuring a height of said workpiece from a datum, and for feeding a signal to said control means to enable an adjustment of said height.

9. The electron beam, nanometer-level metrology tool as recited in claim 1, further comprising:

a charge collector juxtaposed to said beam interrogation region and biased to attract stray electrons.

10. The electron beam, nanometer-level metrology tool as recited in claim 1, further comprising:

an ion gun juxtaposed to said beam interrogation region for supplying a source of positive ions; and means for biasing said ion gun to enable a discharge of ions upon a negative charge buildup on a workpiece surface, said ions acting to neutralize said charge buildup.

11. The electron beam, nanometer-level metrology tool as recited in claim 1, wherein said beam control means further includes:

upper and lower electrostatic deflection means positioned in said path traversed by said beam; and adjustable voltage means for applying d.c. voltages to said upper and lower electrostatic deflection means, respectively, for enabling a scanning of said beam across said beam interrogation region, while said beam remains substantially orthogonal to said workpiece surface, said adjustable voltage means including means for applying a positive voltage to one said electrostatic deflection means and a negative voltage to another said electrostatic deflection means and adjusting together said positive voltage and said negative voltage in opposite sense directions, that is, when one said voltage is adjusted positively, the other said voltage is adjusted negatively and vice-versa.

* * * * *

UNITED STATES PATENT AND TRADEMARK OFFICE
CERTIFICATE OF CORRECTION

PATENT NO. : 5,585,629
DATED : December 17, 1996
INVENTOR(S) : Doran et al.

It is certified that error appears in the above-identified patent and that said Letters Patent is hereby corrected as shown below:

In col. 8, claim 3, line 66, the number "13" should be --11--.

Signed and Sealed this

First Day of April, 1997

BRUCE LEHMAN

*Attest:*

*Attesting Officer*  *Commissioner of Patents and Trademarks*